United States Patent
Wangler et al.

(10) Patent No.: US 9,563,129 B2
(45) Date of Patent: Feb. 7, 2017

(54) MONITOR SYSTEM FOR DETERMINING ORIENTATIONS OF MIRROR ELEMENTS AND EUV LITHOGRAPHY SYSTEM

(71) Applicant: Carl Zeiss SMT GmbH, Oberkochen (DE)

(72) Inventors: Johannes Wangler, Koenigsbronn (DE); Johannes Eisenmenger, Ulm (DE); Markus Deguenther, Aalen (DE); Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 136 days.

(21) Appl. No.: 14/665,420

(22) Filed: Mar. 23, 2015

(65) Prior Publication Data

US 2015/0198894 A1 Jul. 16, 2015

Related U.S. Application Data

(63) Continuation of application No. PCT/EP2013/003011, filed on Oct. 7, 2013.

(Continued)

(30) Foreign Application Priority Data

Oct. 5, 2012 (DE) .................. 10 2012 218 221

(51) Int. Cl.
*G03B 27/54* (2006.01)
*G03F 7/20* (2006.01)
(Continued)

(52) U.S. Cl.
CPC .......... *G03F 7/70033* (2013.01); *G01B 11/14* (2013.01); *G01M 11/005* (2013.01);
(Continued)

(58) Field of Classification Search
CPC .............. G03F 7/70033; G03F 7/70075; G03F 7/70116; G03F 7/7085; G01B 11/14; G01M 11/005; G02B 26/0833
(Continued)

(56) References Cited

U.S. PATENT DOCUMENTS

2002/0141071 A1 10/2002 Singer et al.
2005/0274897 A1 12/2005 Singer et al.
(Continued)

FOREIGN PATENT DOCUMENTS

CN 1879062 A 12/2006
CN 101171547 A 4/2008
(Continued)

OTHER PUBLICATIONS

Chinese Office Action, with translation thereof, for corresponding CN Appl No. 201380057059.8, dated Feb. 2, 2016.
(Continued)

*Primary Examiner* — Peter B Kim
(74) *Attorney, Agent, or Firm* — Fish & Richardson P.C.

(57) ABSTRACT

An EUV lithography system has an EUV beam path and a monitor beam path. The EUV beam path includes a mirror system having plurality of mirror elements, the orientations of which can be changed. The monitor beam path includes a monitor radiation source, a screen and a spatially resolving detector. The mirror system is arranged in the monitor beam path between the monitor radiation source and the screen.

29 Claims, 5 Drawing Sheets

Related U.S. Application Data

(60) Provisional application No. 61/710,075, filed on Oct. 5, 2012.

(51) Int. Cl.
*G02B 26/08* (2006.01)
*G01B 11/14* (2006.01)
*G01M 11/00* (2006.01)

(52) U.S. Cl.
CPC ..... *G02B 26/0833* (2013.01); *G03F 7/70075* (2013.01); *G03F 7/7085* (2013.01); *G03F 7/70116* (2013.01)

(58) Field of Classification Search
USPC .......................................................... 355/67
See application file for complete search history.

(56) References Cited

U.S. PATENT DOCUMENTS

| | | |
|---|---|---|
| 2006/0238737 A1 | 10/2006 | Nakauchi |
| 2007/0058274 A1 | 3/2007 | Singer et al. |
| 2007/0165202 A1 | 7/2007 | Koehler et al. |
| 2008/0024746 A1 | 1/2008 | Mann |
| 2009/0213345 A1 | 8/2009 | Mann |
| 2010/0039629 A1 | 2/2010 | Xalter et al. |
| 2011/0141445 A1 | 6/2011 | Endres et al. |
| 2012/0105865 A1 | 5/2012 | Patra |
| 2012/0229787 A1 | 9/2012 | Van Schoot et al. |
| 2013/0265560 A1 | 10/2013 | Dinger et al. |

FOREIGN PATENT DOCUMENTS

| | | |
|---|---|---|
| CN | 101349871 A | 1/2009 |
| CN | 101636696 A | 1/2010 |
| CN | 201917562 U | 8/2011 |
| CN | 102310264 A | 1/2012 |
| CN | 102612667 A | 7/2012 |
| DE | 10 2009 009 372 A1 | 8/2010 |
| DE | 10 2009 054 540 A1 | 6/2011 |
| EP | 1 202 101 A2 | 5/2002 |
| EP | 1 717 639 A2 | 11/2006 |
| EP | 2 192 446 A1 | 6/2010 |
| EP | 1 649 324 B1 | 3/2011 |
| JP | 2010-518595 A | 5/2010 |
| JP | 2010-191127 A | 9/2010 |
| WO | WO 2004/034146 A2 | 4/2004 |
| WO | WO 2008/095695 A2 | 8/2008 |
| WO | WO 2011/006522 A1 | 1/2011 |
| WO | WO 2012/076188 A1 | 6/2012 |

OTHER PUBLICATIONS

Japanese Office Action, with translation thereof, for corresponding JP Appl No. 2015-534935, dated May 24, 2016.
International Search Report and Written Opinion for corresponding PCT Appl No. PCT/EP2013/003011, dated Feb. 10, 2014.
German Office Action, with translation thereof, for corresponding DE Appl No. 10 2012 218 221.7, dated Aug. 6, 2014.

MONITOR SYSTEM FOR DETERMINING ORIENTATIONS OF MIRROR ELEMENTS AND EUV LITHOGRAPHY SYSTEM

CROSS-REFERENCE TO RELATED APPLICATIONS

The present application is a continuation of, and claims benefit under 35 USC 120 to, international application PCT/EP2013/003011, filed Oct. 7, 2013, which claims benefit under 35 USC 119 of German Application No. 10 2012 218 221.7, filed Oct. 5, 2012. International application PCT/EP2013/003011 also claims priority under 35 USC 119(e) to U.S. Provisional Application No. 61/710,075, filed Oct. 5, 2012. The entire disclosure of international application PCT/EP2013/003011 is incorporated by reference herein.

FIELD

The invention relates to a monitor system for determining orientations of mirror elements and to an EUV lithography system with such a monitor system.

BACKGROUND

An EUV lithography system can be used for producing miniaturized components by virtue of a structure to be imaged, which is also referred to as mask or reticle, being imaged onto a radiation-sensitive structure, which is also referred to as resist, via EUV radiation. The EUV radiation is ultraviolet radiation, in particular with wavelengths in the region of extreme ultraviolet (EUV), such as, for example, with wavelengths in the range from 5 nm to 30 nm.

An EUV lithography system known from EP 1 202 101 A2 comprises an imaging optical unit, which is configured to image an object plane, in which a structure to be imaged can be arranged, into an image plane, in which a radiation-sensitive structure can be arranged, an EUV radiation source, and a first mirror system, which is arranged in an EUV beam path between the EUV radiation source and the object plane and which comprises a base and a plurality of mirror elements which are fixed to the base, the orientation of which mirror elements relative to the base can be set in each case in order to enable different settings of an angular distribution of the EUV radiation incident on the structure to be imaged.

The problem consists of setting the plurality of mirror elements of the mirror system relative to the base thereof or relative to another component of an optical system, into which the mirror system is integrated, or relative to an optical axis or a field plane or a pupil plane of such an optical system such that a desired setting of the angular distribution is realized and the latter is also maintained during operation of the EUV lithography system.

SUMMARY

The present invention has been accomplished taking the above problems into consideration.

Embodiments of the present invention provide an optical system which comprises a system of mirror elements, the orientations of which can be set, and a monitor system for determining the orientations of the mirror elements.

Other embodiments of the present invention provide an EUV lithography system which comprises a system of mirror elements, the orientations of which can be set, and a monitor system for determining the orientations of the mirror elements.

In accordance with some particular embodiments, an optical system comprises a mirror system and a monitor system, wherein the mirror system has a plurality of mirror elements, wherein orientations of the mirror elements can in each case be set independently of one another, and wherein the monitor system is provided for determining the orientations of the mirror elements and comprises the following: a monitor radiation source, which is configured to illuminate the plurality of mirror elements with light having a plurality of different wavelengths; a monitor lens with an object plane, an image plane and a pupil plane arranged between the object plane and the image plane; a color filter, which has wavelength-dependent transmission properties which differ from one another at different positions; and a spatially resolving and wavelength-resolving light detector with a detection area; wherein the mirror elements are arranged in a region of the object plane of the monitor lens; wherein the detection area of the light detector is arranged in a region of the image plane of the monitor lens; and wherein the color filter is arranged in a region of the pupil plane of the monitor lens.

The mirror system with the plurality of mirror elements can be integrated in a further optical system and, in the latter, satisfy an object required for the functioning of the further optical system, wherein, for the purposes thereof, e.g. predetermined orientations of the mirror elements relative to one another or relative to another reference, such as e.g. a base on which the mirror elements are attached, may be required. The monitor system is then configured to determine the orientations of the mirror elements such that, depending on the determined orientations, specific measures may be taken.

The monitor lens images the object plane into the image plane such that the object plane and the image plane are planes that are optically conjugate to one another. Light beams which emanate from a given point in the object plane at different angles are once again incident on a single point in the image plane from different angles. A pupil plane of the monitor lens is arranged in the beam path between the object plane and the image plane. There, the pupil plane has a property that light beams which emanate from different points in the object plane at the same angle intersect the pupil plane at the same point.

The mirror elements are arranged in a region of the object plane of the monitor lens, i.e. the optically effective mirror areas of the mirror elements are either arranged exactly in the object plane of the monitor lens or they are arranged at not too great a distance therefrom such that imaging of the mirror elements into the image plane of the monitor lens is possible with an acceptable imaging quality. It is furthermore possible for the object plane and also the image plane of the monitor lens not to be exactly planar planes but rather to be curved planes due to a desired or undesired field curvature. Nor do the surfaces of the mirror elements need to be arranged exactly in a planar plane but can rather be arranged in a curved two-dimensional area.

Since the monitor lens optically images the mirror elements on the spatially resolving detector, light emitted by the monitor radiation source and reflected at a specific mirror element will—provided it enters the monitor lens—be incident at a point on the spatially resolving detector which is associated with the specific mirror element due to the optical imaging, to be precise independently of which orientation the specific mirror element has relative to the base.

An important condition for the quality of the imaging or the geometric position of object area, image area and detector arrangement is that there is a core region on the detector for each optically effective mirror area, with only light from this mirror area and not light from another mirror area impinging on the core region. However, for detection it is not necessary that each point on the detector is only impinged upon by light from one mirror area. This renders it possible to reduce the complexity of the monitor lens.

However, the light reflected at the specific mirror element passes through the pupil plane of the monitor lens at a point which is dependent on the angle at which the reflected light leaves the object plane. This angle is in turn dependent on the orientation of the specific mirror element. Arranged in the pupil plane is the color filter which, depending on the position, has different transmission properties for different wavelengths of the light. As a result, the light incident on the detector at the point corresponding to the specific mirror element experiences color filtering by the color filter, which is dependent on the orientation of the specific mirror element. This leads to the light incident on the detector at the point associated with the specific mirror element having a color or wavelength distribution which is dependent on the orientation of the specific mirror element. This color or wavelength distribution can be determined by the wavelength-resolving light detector, and so, conversely, the orientation of the mirror element can be deduced from the determined color.

In accordance with exemplary embodiments, the optical system furthermore comprises a control, which is configured to analyze light intensities detected by the light detector and determine orientations of the mirror elements, wherein the orientation of each individual mirror element is determined depending on wavelengths detected at a position on the detection area of the detector associated with the respective mirror element.

The light detector can be any type of light detector which is able to detect light incident thereon dependent on both position and wavelength. The light detector can comprise a plurality of detector pixels, with each individual detector pixel being able to provide a detection signal which represents the light intensity incident on the detector pixel. The detector pixels can comprise color filters such that various detector pixels adjacent to one another are sensitive to different colors of the incident light. An example of such a color filter is the so-called Bayer filter. In accordance with further embodiments, the light detector comprises at least one dichroic beam splitter and at least two groups of detector pixels, with one partial beam generated by the beam splitter being incident on one group of pixels and the other partial beam generated by the beam splitter being incident on the other group of pixels such that the different groups of pixels detect different colors or wavelengths of the light.

In accordance with a further embodiment, the fact that light of different colors can penetrate to a different depth in the detector material is exploited. By picking up the charge carriers, generated by the light, at different depths of the detector, it is possible to derive color information.

In accordance with exemplary embodiments, the mirror system comprises a plurality of actuators which are configured to change the orientation of at least some of the mirror areas relative to the base, wherein the control is configured to actuate the actuators on the basis of the determined orientation of at least one of the mirror elements. As a result of this, it is possible to measure the orientations of the mirror elements during the operation of the mirror system, determine whether the orientations correspond to desired orientations, and, optionally, to correct the orientations of the mirror elements by actuating the actuators. The orientations of the mirror elements can therefore be regulated during operation (closed-loop control).

In accordance with exemplary embodiments, the monitor radiation source is a point source, i.e. a radiation source with a diameter that is as small as possible. The diameter of the light-emitting part of the monitor radiation source can, for example, be less than 2.0 mm or less than 1.0 mm or less than 0.5 mm.

In accordance with specific embodiments, the monitor system comprises several monitor radiation sources arranged next to one another. This leads to the light of the various monitor radiation sources being incident on the mirror elements at different angles and a number of light beams, which correspond to the number of monitor radiation sources, being emitted by each mirror element in the direction toward the monitor lens at different angles. Since merely one of the reflected beams has to be detected by the detector for determining the orientation of a specific mirror element, it is possible to reduce an effective diameter of the monitor lens compared to an embodiment with merely a single monitor radiation source such that some of the light beams reflected at the specific mirror element do not enter the monitor lens and are imaged on the detector. The comparatively smaller monitor lens can be advantageous in respect of lower costs and less required installation space.

In accordance with further embodiments, provision is made for a plurality of monitor lenses, a plurality of color filters and a plurality of light detectors, wherein the mirror elements are arranged in a region of the object plane of each individual one of the monitor lenses, wherein the detection area of each one of the plurality of light detectors is arranged in a region of the image plane of each individual one of the monitor lenses, and wherein one of the plurality of color filters is arranged in a region of the pupil plane of each individual one of the monitor lenses. The plurality of monitor lenses can, compared to a design with a single monitor lens, have a smaller more effective diameter, which can likewise be advantageous in respect of lower costs and taking up less installation space.

In accordance with embodiments, the invention proposes an EUV lithography system with an EUV beam path, comprising: an imaging optical unit, which is arranged in the EUV beam path and configured to image an object plane of the imaging optical unit, in which a structure to be imaged can be arranged, into an image plane of the imaging optical unit, in which a radiation-sensitive structure can be arranged, an EUV radiation source and a mirror system which comprises a base and a plurality of mirror elements, which are attached to the base, wherein orientations of the mirror elements relative to the base can be set in each case; and a monitor system for determining the orientations of the mirror elements, wherein the monitor system comprises: a monitor radiation source, which is configured to illuminate the plurality of mirror elements with light having a plurality of different wavelengths; a monitor lens with an object plane, an image plane and a pupil plane arranged between the object plane and the image plane; a color filter, which has wavelength-dependent transmission properties which differ from one another at different positions; and a spatially resolving and wavelength-resolving light detector with a detection area; wherein the mirror elements are arranged in a region of the object plane of the monitor lens; wherein the detection area of the light detector is arranged in a region of the image plane of the monitor lens; wherein the color filter is arranged in a region of the pupil plane of the monitor lens, and wherein the mirror elements of the mirror system are arranged in the EUV beam path between the EUV radiation source and the object plane of the imaging optical unit.

In accordance with exemplary embodiments, the mirror system comprises more than 1000 mirror elements, more than 10 000 mirror elements or even more than 100 000 mirror elements.

In accordance with further exemplary embodiments, the mirror areas of the mirror elements are arranged next to one another within an overall mirror area, wherein a diameter of the overall mirror area is greater than 100 mm or greater than 150 mm.

In accordance with exemplary embodiments, the mirror areas of the mirror elements have an area of less than 1 mm². By way of example, the mirror elements can have a square mirror area, the edge length of which is 0.5 mm or less.

In accordance with further exemplary embodiments, the orientations of the mirror elements can each be changed by more than ±0.05 rad, in particular by more than ±0.1 rad. Furthermore, the orientations of the mirror elements can be changeable in two mutually independent directions.

In accordance with exemplary embodiments, the imaging by the monitor lens is a reducing imaging. By way of example, an absolute value of a linear magnification of the monitor lens for the imaging thereof from the object plane of the monitor lens into the image plane of the monitor lens can be less than 0.6 or less than 0.3.

In accordance with exemplary embodiments, the light detector has a plurality of detector pixels, wherein the number of detector pixels is substantially greater than the number of mirror elements arranged in an object field of the monitor lens. By way of example, the number of detector pixels is 10 times greater or 100 times greater than the number of mirror elements arranged in the object field of the monitor lens. As a result of this, it is possible that light reflected by a specific mirror element is simultaneously incident on a plurality of pixels of the detector and is detected by these such that a plurality of pixels of the detector contribute to determining the color of the incident light. What this achieves is an increase in the precision of the detected color of the light and hence an increase in the precision of determining the orientation of the specific mirror element.

In accordance with other exemplary embodiments, light reflected by a specific mirror element is incident on exactly one pixel of the detector such that the pivot position of the specific mirror element is possible by evaluating light intensities which are detected by a single pixel of the detector.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
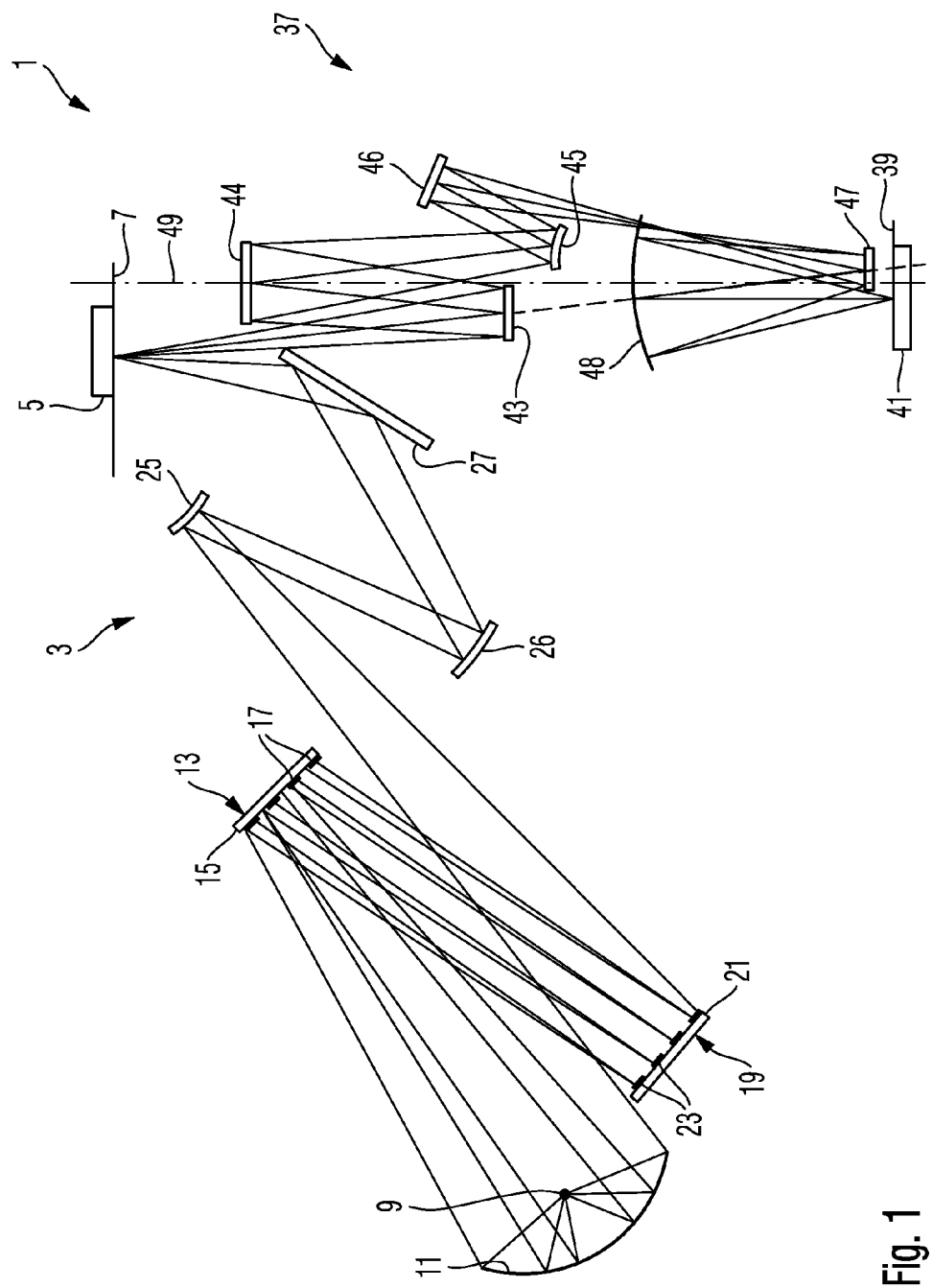
FIG. 1 shows a schematic illustration of an EUV beam path of an EUV lithography system in accordance with one embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 shows, in a schematic illustration, an EUV lithography system 1 and serves to explain an EUV beam path 3 of the EUV lithography system. The EUV beam path 3 of the lithography system 1 serves for imaging a structure 5 to be imaged, the surface of which is arranged in an object plane 7 of the lithography system 1. To this end, the structure 5 to be imaged is illuminated by EUV radiation, which is generated by an EUV radiation source 9. The EUV radiation source 9 can, for example, be a plasma radiation source, which emits EUV radiation in a wavelength region of, for example, 5 nm to 15 nm. Part of the radiation emitted by the EUV radiation source is reflected in a collimated manner at a collector mirror 11 such that it is incident on a first mirror system 13, which comprises a base 15 and a plurality of mirror elements 17 attached to the base 15. EUV radiation reflected at the mirror elements 17 is incident on a second mirror system 19, which comprises a base 21 and a plurality of mirror elements 23 attached to the base 21. EUV radiation reflected at the mirror elements 23 can be directed to the structure 5 to be imaged, either directly or indirectly after reflection at one or more further mirrors. In the illustrated exemplary embodiment, the EUV radiation reflected at the mirror elements 23 is directed to the structure 5 to be imaged after reflection at three mirrors 25, 26 and 27 arranged one behind the other in the EUV beam path.

The two mirror systems 13 and 19 serve to illuminate a selected field in the object plane 7 of the EUV lithography system and thereby set an angular distribution, with which the light is incident on the object plane 7, by changing the orientations of mirror elements and/or setting a design and extent of the illuminated field in the object plane 7 by changing the orientations of the mirror elements of the two mirror systems. To this end, the two mirror systems can have a similar design.

Figure 2:
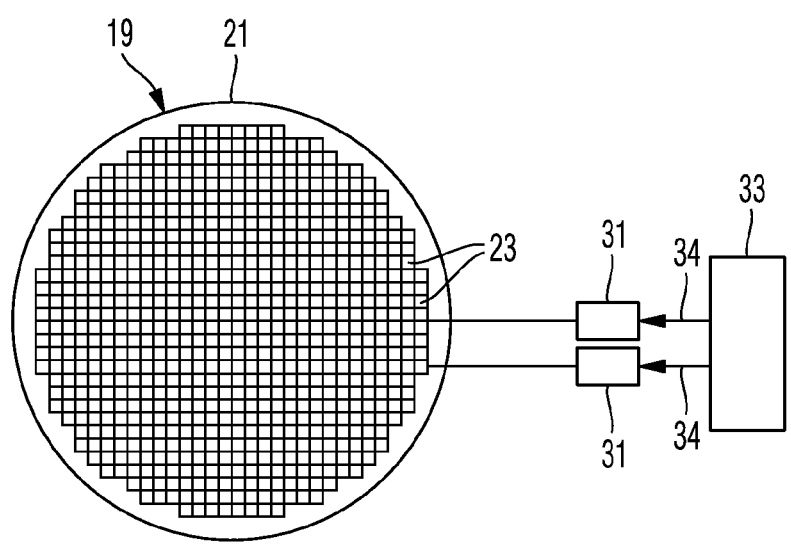
FIG. 2 shows a schematic illustration of a top view of a mirror system with a plurality of mirror elements of the EUV lithography system from FIG. 1.

FIG. 2 shows a schematic illustration of an example for the design of a mirror system on the basis of the mirror system 19. The mirror areas of the mirror elements 23 of the mirror system 19 have a square design. Other designs of the mirror areas are possible.

The number of mirror elements 23 of the mirror system 19 can be greater than 1000, greater than 10 000 and greater than 100 000. By way of example, a diameter of the mirror system 19 can lie in a region from 200 mm to 300 mm. The individual mirror elements can each be deflected from a rest position by ±0.1 rad in two linearly independent directions by the actuators 31. The actuators can operate according to a piezoelectric principle, an electrostatic principle or other principles.

The mirror system 19 has a plurality of actuators 31, of which merely two are shown in FIG. 2 in an exemplary manner, for changing an orientation of the mirror areas of several or all of the mirror elements 23 relative to the base 15. The actuators 31 are controlled by a control 33 via control lines 34. The actuators 31 are actuated by the control 33 in order to set a desired angular distribution and/or spatial distribution of the EUV radiation incident on the object plane 7. Background information in relation to setting the EUV radiation in this manner can be gathered from EP 1 202 101 A2 and DE 10 2009 054 540.9, the disclosures of which are entirely incorporated into the present application.

The EUV lithography system 1 furthermore comprises an imaging optical unit 37, which is arranged in the EUV beam path 3 between the object plane 7 and an image plane 39, in which a surface of a radiation-sensitive structure 41 can be arranged and on which the structure 5 to be imaged is imaged by the imaging optical unit 37. To this end, the imaging optical unit 37 comprises a plurality of mirrors 43, 44, 45, 46, 47 and 48, on which the EUV radiation is reflected in sequence after reflection on the structure 5 to be imaged. Although the imaging optical unit 37 of the depicted exemplary embodiment has six mirrors 43 to 48, which are arranged along an optical axis 49 of the imaging optical unit 37, other examples of imaging optical units may comprise a greater or smaller number of mirrors for obtaining the imaging of the object plane 7 in the image plane 39.

Figure 3:
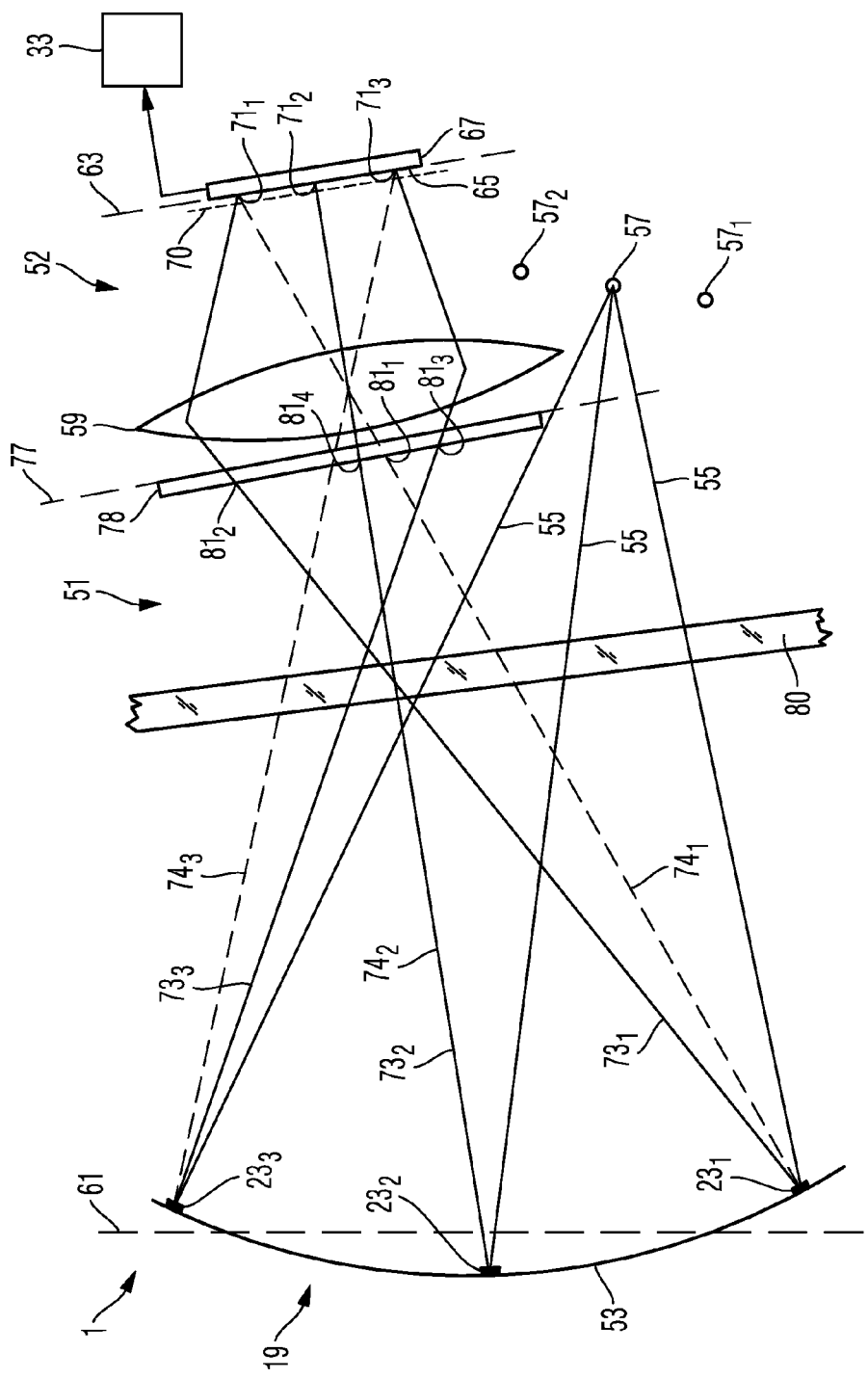
FIG. 3 shows a schematic illustration of a monitor system for the mirror system shown in FIG. 2.

FIG. 3 shows a schematic illustration of a monitor beam path 51 of the EUV lithography system 1. The monitor beam path 51 comprises a monitor system 52 and serves to determine orientations of the mirror areas of the mirror elements 23 of the mirror system 19 relative to the base 21 thereof. In FIG. 3, merely three mirror elements $23_1$, $23_2$, $23_3$ of the mirror system 19 are depicted in a cross section in an exemplary fashion. The mirror elements 23 are arranged on a spherically curved area 53, the radius of curvature of which is approximately 1 m.

The mirror elements 23 are illuminated by light 55, which is generated by a monitor radiation source 57, which is a point light source. Naturally, the point light source is not infinitely small in practice but rather has a finite extent such that a diameter of the monitor radiation source 57 is e.g. 0.5 mm. The light generated by the monitor radiation source 57 and directed to the mirror elements 23 has many different wavelengths, i.e. many different colors, and can, in particular, be visible white light.

The monitor system 52 comprises a monitor lens 59, which is depicted schematically in FIG. 3 as an optical lens element. In practice, the monitor lens will comprise several lens elements in order to provide imaging with high optical quality. To this end, the monitor lens can, in particular, be color-corrected.

The monitor lens 59 has an object plane 61, which it images into an image plane 63 conjugate thereto. Arranged in the image plane 63 is a detection area 65 of a light detector 67 in order to detect an image of the object plane 61 in a spatially resolved and wavelength-resolved manner and output it to the control 33.

The mirror elements 23 of the mirror system 19 are arranged in a region around the object plane 61 of the monitor lens 51. It can already be seen on the basis of the curvature of the area 53 in which the mirror elements 23 are arranged that the mirror elements need not lie exactly on the object plane 61. However, the mirror elements 23 lie in the region around the object plane 61 such that imaging the mirror elements 23 onto the detection area 65 of the light detector 67 is possible with a sufficient imaging quality. Furthermore, it is possible for the monitor lens 59 to be embodied such that the object plane thereof has such a field curvature that it is approximated to the design of the area 53 in which the mirror elements 23 are arranged.

The monitor lens 59 images the mirror elements 23 into the image plane 63 of the monitor lens 59 and therefore onto the detection area 65 of the light detector 67. An image of the mirror element $23_1$ is generated due to the imaging at a position $71_1$ on the detection area 65, an image of the mirror element $23_2$ is generated at a position $71_2$, and an image of the mirror element $23_3$ is generated at a position $71_3$ on the detection area 65. A line $73_1$ in FIG. 3 represents the light beam 55 reflected at the mirror element $23_1$ in the case of a given orientation of the mirror element $23_1$. In its neutral position, the mirror $23_1$ would direct the light beam 55 to the center of the monitor lens as a light beam denoted by $74_1$ and plotted by a dashed line. Independent of the orientation of the mirror element $23_1$, the light 55 reflected at the mirror element $23_1$ is always incident at the position $71_1$ on the detection area 65 of the detector 67, i.e. at this position the detector 65 is always able to detect light which was reflected at the mirror element $23_1$. The position $71_1$ is associated with the mirror element $23_1$ due to the optical imaging provided by the monitor lens 59.

A color filter 78 is arranged in a pupil plane 77 of the monitor lens 59 which is arranged between the object plane 61 and the image plane 63 of the monitor lens 59. The two light beams $73_1$ and $74_1$, which emanate from the same mirror element $23_1$, pass through the pupil plane 77 and hence through the color filter 78 at different positions $81_1$ and $81_2$. At these two positions the color filter 78 has wavelength-dependent transmission properties that are different from one another such that the color of the light detected at the position $71_1$ changes when the orientation of the mirror element $23_1$ changes. The wavelength-dependent transmission properties of the color filter 78 are designed such that it is possible to deduce the orientation of the mirror element $23_1$ from the color of the light detected at the position $71_1$. The control 53 is configured, for each individual mirror element, to detect light incident on the position of the detector associated with the element and analyze the light in respect of its color and generate a signal from this, which represents the orientation of the respective mirror element.

In a similar manner, FIG. 3 shows, using a dashed line $74_3$, the measurement light reflected at the mirror element $23_3$ when this mirror element $23_3$ is in its neutral, non-deflected orientation and a line $73_3$ represents the light reflected at the mirror element $23_3$ in the case of an exemplary orientation which passes through the color filter 78 at a position $81_3$ and is incident on the detection area 65 of the detector 67 at the position $71_3$. By evaluating the light detected at the position $71_3$ in respect of its wavelength distribution, the control 33 can deduce that this light passed through the color filter 78 at the position $81_3$. From this position, it is possible unambiguously to determine the orientation of the mirror element $23_3$.

For the mirror element $23_2$, FIG. 3 depicts the situation where it is in its neutral, non-deflected position such that the corresponding lines $23_2$ and $74_2$ of the reflected light coincide. This light passes through the color filter at a position $81_4$ and is incident on the detection area 65 of the detector 67 at the position $71_2$. Once again, the control 33 can deduce the position $81_4$ at which the light passes through the color filter 78 from the color of the light incident on the detector 67 at the position $71_2$ and from this it is possible to determine the orientation of the mirror element $23_2$.

The EUV beam path of the EUV lithography system must be arranged in vacuo. Hence the system comprises a vacuum vessel which defines a vacuum space, within which those elements which define the EUV beam path are arranged.

These include the mirror elements 23. The monitor beam path 51 need not necessarily be arranged within the vacuum space. It can in part be arranged outside of the vacuum space. Such a situation is illustrated in FIG. 3, in which reference sign 80 denotes a window transparent to the monitor radiation, which window is part of the vacuum vessel. The monitor beam path 51 passes through the window 80, and so the monitor lens 59 and the detector 67 can be arranged outside of the vacuum.

Reference sign 70 in FIG. 3 denotes a perforated stop, which may be arranged in the beam path upstream of the detection area 65 of the detector 67. The perforated stop 70 consists of a plate opaque to the monitor radiation, which has light-transmissive openings at the positions which correspond to the positions of the mirror elements 23 due to the optical imaging through the monitor lens 59. The perforated plate 70 may have the object of stopping stray radiation such that the latter does not reach the detection area 65 of the detector 67 such that it becomes simpler to determine the color of the light passing through the opening of the perforated plate and detected by the detector.

Figure 4:
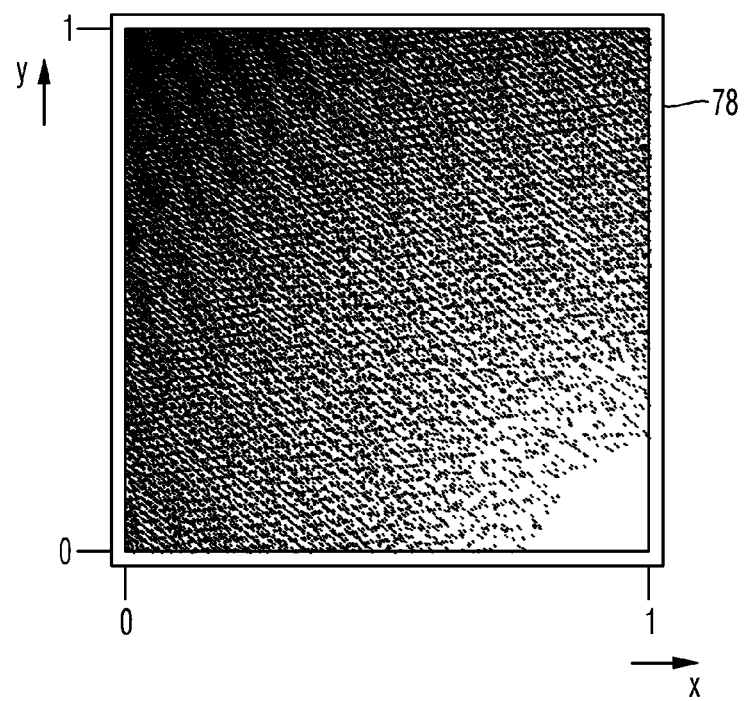
FIG. 4 shows a schematic illustration of a color filter of the monitor system shown in FIG. 3.

FIG. 4 shows a schematic illustration of a color profile of the color filter 78. In the illustrated example, the filter 78 contains the colors red, green and blue, the color saturation of which changes in the horizontal direction x and in the vertical direction y. In the illustrated example, the values of the coordinates x and y of positions within the filter in each case lie between 0 and 1.

In the case of an exemplary filter, the color saturation for the colors red, green and blue is designed such that the following applies:

red=$x$;green=$y$;blue=1−0.5*($x+y$).

In accordance with another exemplary embodiment, the following applies:

red=0.5*$x$;green=0.5*$y$;blue=1−0.5*($x+y$).

This color filter has a linear color profile, which, for the three colors red, green and blue, respectively provides values of the degree of transmission, which changes linearly with the values of the spatial coordinates on the color filter. Such a linear design of the color filter can be advantageous if a color centroid, i.e. a mean color value, of a light beam passing through the color filter is to be determined, which light beam passes through the color filter over an extended region and therefore is subject to different transmission properties within the beam cross section thereof. What is then nevertheless sought after is the transmission property present in the center of the beam passing through the color filter and this transmission property corresponds to the centroid or mean value of the various transmission properties within the beam. What the linear color profile ensures is that the centroid or center point can be determined even if no information is available in respect of the shape and/or extent of the beam passing through the color filter.

By way of example, the filter can be realized by a reversal film, which is exposed in an automatically controlled method to light of different wavelengths and is subsequently developed and fixed.

It is possible to see from FIG. 3 that the monitor lens 59 must have a sufficiently large diameter such that the radiation of the monitor radiation source 57, reflected at the mirror elements 23, enters the monitor lens 59 in the case of all orientations of the mirror elements 23 occurring in practice. This requires a relatively large monitor lens 59.

Figure 5:
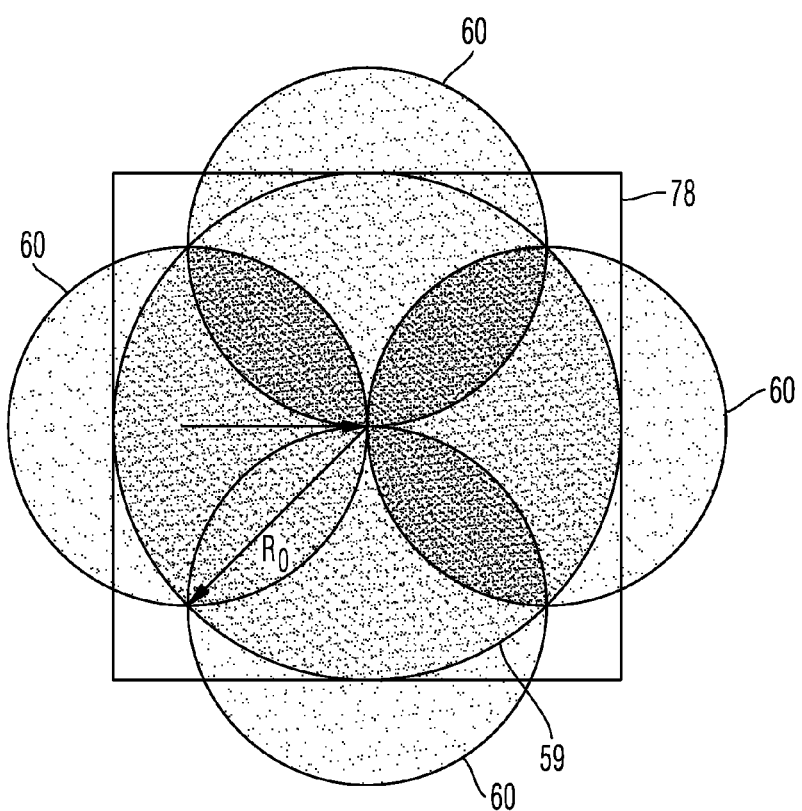
FIG. 5 shows a schematic illustration for explaining a use of a plurality of monitor radiation sources.

FIG. 5 is a schematic illustration for explaining a measure for reducing the size of the monitor lens. In the example explained on the basis of FIG. 5, it is not a point light source which is employed as monitor radiation source 57, but rather use is made of four monitor radiation sources arranged next to one another. Positions of two of the four point light sources are provided with reference signs 57$_1$ and 57$_2$ in FIG. 3.

In FIG. 5, a great circle 59 provided with reference sign 59 represents the diameter of the monitor lens in the case of the use, depicted in FIG. 3, of merely one monitor radiation source 57. Within this circle 59, the light beams reflected at all mirror elements 23 in all orientations are incident on the color filter 78 arranged in the pupil plane 77. The circle 59 has a diameter $R_0$. If four light sources are used, the region of the circle 59 can be covered by four smaller circles 60 with a radius $r=R_0/(2*\cos 45°=0.707 R_0$. This means that a monitor lens with a color filter with a smaller radius r can be employed in order to detect radiation which is reflected by each mirror element 23 and emanates from at least one of the light sources. Here, a redundancy may occur, i.e. it may be the case that light is detected at a position of the detector associated with a mirror element, which light emanates from two different light sources and has passed through the color filter at two different positions. As a result, it is not possible to determine uniquely the position of the color filter at which the light reflected by the mirror element has passed through the color filter from analyzing the detected light. As a result, it is not possible to determine the angular position of the mirror element in an unambiguous manner either from analyzing the detected light. This lack of uniqueness can for example be redressed by virtue of the plurality of light sources being operated in a temporally intensity modulated fashion and taking account of this temporal intensity modulation when detecting the various colors on the detector. By way of example, it is possible that it is always only one of the four light sources that is operated alternatively at a given time. Then the assignment of a color detected at the detector can be uniquely assigned to a specific light source and hence it is possible to determine uniquely the orientation of the mirror element in question. In the example described on the basis of FIG. 5, use is made of four monitor radiation sources. However, it is possible to employ a different number of monitor radiation sources, such as e.g. two monitor radiation sources, six monitor radiation sources or even more monitor radiation sources.

In another embodiment, the various light sources are not actuated in succession, i.e. they are not actuated by time multiplexing but rather by frequency multiplexing. At least two of the light sources are operated at the same time, but the temporal intensity modulation is brought about with different frequencies. It is known from WO 2008/095695 A2 that this is advantageous for specific detectors.

Figure 6:
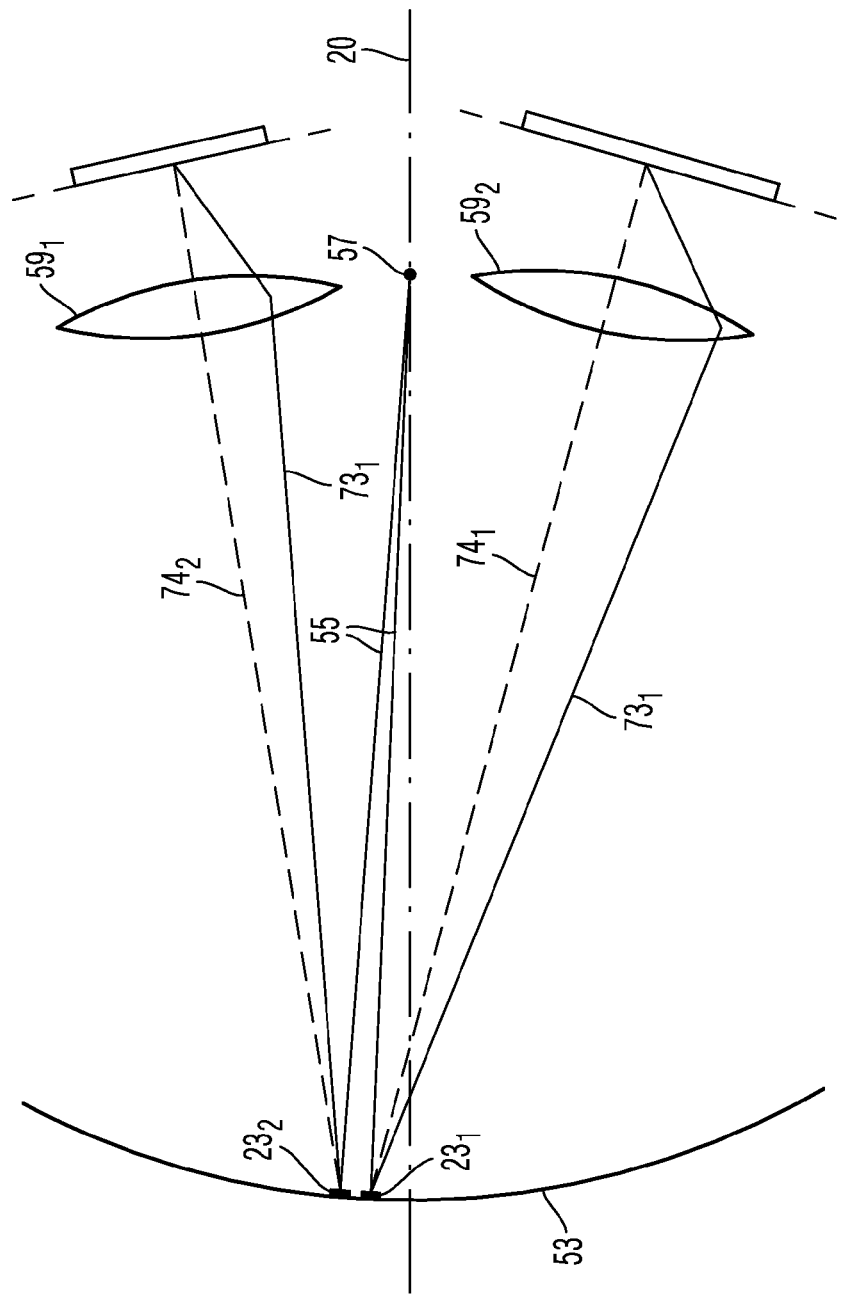
FIG. 6 shows a schematic illustration of a monitor system with a plurality of monitor lenses.

FIG. 6 explains a further example for reducing the size of monitor lenses and hence for saving necessary installation space. While the optical system explained on the basis of FIG. 3 has a single monitor lens, the optical system depicted in FIG. 6 has four monitor lenses, of which two monitor lenses 59$_1$ and 59$_2$ are depicted as optical lens elements in a simplified manner. The four monitor lenses are arranged distributed in the circumferential direction about a central axis 20, wherein a monitor radiation source 57 lies on the axis 20.

In this example, there can be pivoted positions of individual mirror elements 23, which lead to the light reflected at these not entering into one of the monitor lenses 59$_1$, 59$_2$. If this constitutes a problem, this can be redressed, for example, by virtue of the fact that use is made of not only one monitor radiation source 57 but of several monitor radiation sources, as already explained above on the basis of FIG. 5. If there are pivoted positions of individual mirror elements which lead to the light reflected at these not entering into one of the monitor lenses, this may be acceptable in some applications provided that there are enough pivoted positions for each mirror element in which the light reflected at these enters into a monitor lens. When prescribing target pivoted positions for the individual mirror elements, it is then necessary to take into account the fact that in each case only pivoted positions are associated for which a detection is possible.

The linear change of the saturations of the three colors red, green and blue over the whole region of the filter 78, explained on the basis of FIG. 4, renders it possible to determine uniquely the position at which a light beam passes through the filter. In order to determine this position with a desired accuracy, it is, however, necessary to realize a relatively large number of different colors in the color filter and the detector must be able to resolve a correspondingly large number of different colors. This requirement can be reduced by virtue of, for example, the filter being subdivided into four square portions, where the color saturation of each individual utilized color changes between 0 and 1 in each of the square portions. As a result, if there is no knowledge about the possible position at which a specific light beam passes through the color filter, it is not possible to determine uniquely the position at which the light beam passes through the color filter. However, if an orientation of a mirror element is already known approximately, it is possible to establish from this approximately known orientation in which one of the four portions the light beam reflected at this mirror element passed through the filter and it is then possible to determine uniquely the position at which the light beam passes through the filter within this established portion, and so it is then possible to determine the orientation of the mirror element uniquely and very precisely. Accordingly, it is possible to provide designs of the color filters which enable an increased accuracy in determining the orientation in the case of embodiments in which orientations of the mirror elements are known approximately due to a given actuation of actuators of the mirror elements.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. An optical system, comprising:
a mirror system comprising a plurality of mirror elements, orientations of the mirror elements being settable independently of each other; and
a monitor system configured to determine the orientations of the mirror elements, the monitor system comprising:
 a monitor radiation source configured to illuminate the plurality of mirror elements with light having a plurality of different wavelengths;
 a monitor lens having an object plane, an image plane, and a pupil plane between the object plane and the image plane;
 a color filter having wavelength-dependent transmission properties which differ from one another at different positions of the color filter; and
 a light detector configured to spatially resolve light and to wavelength-resolve light, the light filter having a detection area,
wherein:
 the mirror elements are arranged in a region of the object plane of the monitor lens;
 the detection area of the light detector is arranged in a region of the image plane of the monitor lens; and
 the color filter is arranged in a region of the pupil plane of the monitor lens.

2. The optical system of claim 1, further comprising a controller configured to analyze light intensities detected by the light detector and to determine orientations of the mirror elements, wherein, for each individual mirror element, the orientation of the mirror element is determined depending on wavelengths detected at a position on the detection area of the light detector associated with the mirror element.

3. The optical system of claim 2, wherein the mirror system comprises a plurality of actuators configured to change the orientation of at least some of the mirror elements relative to other mirror elements, and the controller is configured to actuate the actuators based on the determined orientation of at least one of the mirror elements.

4. The optical system of claim 1, wherein the monitor radiation source has a diameter of less than 2.0 mm.

5. The optical system of claim 1, wherein the monitor radiation source has a diameter of less 1.0 mm.

6. The optical system of claim 1, wherein the monitor system comprises a plurality of monitor radiation sources arranged at a distance from one another.

7. The optical system of claim 6, wherein each of the plurality of monitor radiation sources is configured to emit radiation having a predetermined temporal intensity modulation, and the temporal intensity modulations of at least two monitor radiation sources are different from one another.

8. The optical system of claim 1, wherein:
the monitor system comprises:
 a plurality of monitor lenses;
 a plurality of color filters; and
 a plurality of light detectors,
the mirror elements are arranged in a region of the object plane of each of the monitor lenses;
the detection area of each of the plurality of light detectors is arranged in a region of the image plane of each of the monitor lenses; and
one of the plurality of color filters is arranged in a region of the pupil plane of each of the monitor lenses.

9. The optical system of claim 1, wherein a mask having perforations is arranged in the beam path upstream of the detection area, and the perforations are arranged at positions corresponding to the positions of the mirror elements.

10. A lithography system having an EUV beam path, the lithography system comprising:
imaging optics arranged in the EUV beam path and configured to image an object plane into an image plane;
an optical system according to claim 9; and
an EUV radiation source,
wherein the mirror elements are in the EUV beam path between the EUV radiation source and the object plane of the imaging optical unit.

11. The lithography system of claim 10, wherein the mirror system comprises more than 1000 mirror elements.

12. The lithography system of claim 10, wherein mirror areas of the mirror elements are next to each other within an overall mirror area, an a diameter of the overall mirror area is greater than 100 mm.

13. The lithography system of claim 10, wherein mirror areas of the mirror elements are next to each other within an overall mirror area, an a diameter of the overall mirror area is greater than 150 mm.

14. The lithography system of claim 10, wherein the mirror areas of the mirror elements in each case have an area of less than one square millimeter.

15. The lithography system of claim 10, wherein the orientation of at least one of the mirror elements is changeable by more than ±0.05 rad.

16. The lithography system of claim 10, wherein the orientation of at least one of the mirror elements is changeable by more than ±0.1 rad.

17. The lithography system of claim 10, wherein the orientation of the mirror elements is changeable in two linearly independent directions.

18. The lithography system of claim 10, wherein an absolute value of a linear magnification of the image of the object plane of the monitor lens in the image plane of the monitor lens is less than 0.6.

19. The lithography system of claim 10, wherein an absolute value of a linear magnification of the image of the object plane of the monitor lens in the image plane of the monitor lens is less than 0.3.

20. The lithography system of claim 10, wherein the monitor lens has an image-side numerical aperture NA such that $0.1<NA<0.9$.

21. The lithography system of claim 10, wherein the monitor lens has an image-side numerical aperture NA such that $0.3<NA<0.8$.

22. The lithography system of claim 10, wherein the light detector has a plurality of detector pixels, and a number of the detector pixels is greater than 5 times a number of mirror elements arranged in an object field of the monitor lens.

23. The lithography system of claim 10, wherein the light detector has a plurality of detector pixels, and a number of the detector pixels is greater than 10 times a number of mirror elements arranged in an object field of the monitor lens.

24. The lithography system of claim 10, wherein the light detector has a plurality of detector pixels, each detector pixel comprises a color filter, and directly adjacent detector pixels have color filters that are different from each other.

25. The lithography system of claim 10, wherein:
the light detector comprises a plurality of detector pixels;
the light detector comprises a dichroic beam splitter; and
at least two groups of detector pixels arranged in different beam paths in the beam path are downstream of the dichroic beam splitter.

26. The lithography system of claim 10, wherein the color filter comprises at least 2000 mutually different spectral transmission properties which are resolvable by the light detector.

27. The lithography system of claim 10, further comprising a vacuum vessel, wherein the mirror elements are arranged within the vacuum vessel, and the monitor radiation source and/or the monitor lens is/are arranged outside of the vacuum vessel.

28. The optical system of claim 1, wherein the color filter has a linear spatially dependent profile for at least one wavelength, and values of a degree of transmission of the color filter to light of the at least one wavelength change linearly with a value of a spatial coordinate on the color filter.

29. A method of using a lithography system comprising an imaging optics and an optical system, the method comprising:
using the optical system to illuminate a structure; and
using the imaging optics to image at least a portion of the illuminated structure onto a radiation-sensitive material,
wherein the optical system comprises an optical system according to claim 1.

* * * * *

UNITED STATES PATENT AND TRADEMARK OFFICE
CERTIFICATE OF CORRECTION

| | |
|---|---|
| PATENT NO. | : 9,563,129 B2 |
| APPLICATION NO. | : 14/665420 |
| DATED | : February 7, 2017 |
| INVENTOR(S) | : Johannes Wangler et al. |

It is certified that error appears in the above-identified patent and that said Letters Patent is hereby corrected as shown below:

In the Specification

Column 8, Line 44, delete "733" and insert -- $73_3$ --.

Column 10, Line 5, delete "571" and insert -- $57_1$ --.

Column 10, Line 5, delete "572" and insert -- $57_2$ --.

Column 10, Line 15, delete "r=R0/(2*cos 45°=0.707 R0." and insert
-- r = R0/(2*cos45°) = 0.707 R0. --.

In the Claims

Column 12, Line 27, Claim 5, after "less", insert -- than --.

Column 12, Line 66, Claim 12, delete "an a" and insert -- a --.

Column 13, Line 3, Claim 13, delete "an a" and insert -- a --.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*